(12) United States Patent
Wang et al.

(10) Patent No.: US 6,798,568 B1
(45) Date of Patent: Sep. 28, 2004

(54) POLARIZATION INDEPENDENT SEMICONDUCTOR OPTICAL AMPLIFIER

(75) Inventors: Steve Wang, San Jose, CA (US); Frank Levinson, Palo Alto, CA (US)

(73) Assignee: Finisar Corporation, Sunnyvale, CA (US)

( * ) Notice: Subject to any disclaimer, the term of this patent is extended or adjusted under 35 U.S.C. 154(b) by 30 days.

(21) Appl. No.: 10/134,412

(22) Filed: Apr. 29, 2002

Related U.S. Application Data

(60) Provisional application No. 60/358,051, filed on Feb. 19, 2002.

(51) Int. Cl.$^7$ ............................................... H01S 3/00
(52) U.S. Cl. ....................................................... 359/344
(58) Field of Search ...................... 359/344; 372/43–50

(56) References Cited

U.S. PATENT DOCUMENTS 6,014,250 A  *  1/2000  Granestrand ................. 359/344
6,175,446 B1 *  1/2001  Alphonse ..................... 359/344

* cited by examiner

Primary Examiner—Nelson Moskowitz
Assistant Examiner—Deandra M. Hughes
(74) Attorney, Agent, or Firm—Workman Nydegger

(57) ABSTRACT

Semiconductor optical amplifier with polarization independent gain. A polarization adjusting layer is formed on a semiconductor optical amplifier. The semiconductor optical amplifier has an active region that includes both compressively strained and tensile strained quantum wells. The polarization adjusting layer is formed and then etched to a thickness that repositions an optical signal within the active region such that the gain of the optical signal is independent of the polarization of the optical signal.

19 Claims, 3 Drawing Sheets

POLARIZATION INDEPENDENT SEMICONDUCTOR OPTICAL AMPLIFIER

RELATED APPLICATION

This application claims the benefit of U.S. Provisional Patent Application Ser. No. 60/358,051, entitled "Polarization Independent Semiconductor Optical Amplifier," filed Feb. 19, 2002, which is incorporated herein by reference.

BACKGROUND OF THE INVENTION

1. The Field of the Invention

The present invention relates to semiconductor optical amplifiers. More particularly, the present invention relates to semiconductor optical amplifiers whose gain is independent of the polarization of the optical signal being amplified and to methods of manufacturing or fabricating semiconductor optical amplifiers with polarization independent gain.

2. Background and Relevant Art

Optical communication systems have several advantages over other types of telecommunications networks. Optical fibers are typically made from insulative materials and are therefore less susceptible to interference from electromagnetic sources. Optical fibers also have higher bandwidth capability. In addition, optical fibers are both smaller and lighter than metal cables.

As optical signals are transmitted through the optical fibers of the communication network, the optical signals gradually become weaker over distance. Thus, the optical signals need to be refreshed or strengthened before the signals become too weak to detect. Before the advent of optical amplifiers, regenerators were used to refresh or strengthen the weakened optical signals. Regenerators convert the optical signal to an electrical signal, clean the electric signal, and convert the electrical signal back to an optical signal for continued transmission in the optical communication network. Regenerators, however, can typically only amplify one channel or a single wavelength. Optical amplifiers are an improvement to regenerators because optical amplifiers can amplify light signals of multiple wavelengths simultaneously. One type of optical amplifier is a semiconductor optical amplifier (SOA).

At a basic level, an SOA has multiple layers formed from compound semiconductor materials that are grown on a semiconductor substrate. An SOA usually includes an active layer or region and two cladding layers. The active layer provides optical gain to a light signal and the cladding layers, together with the active layer or region, construct an optical waveguide. The facets of the SOA are formatted by cleaving the semiconductor wafer along a crystal plane, thus forming a mirror. An anti-reflective coating is often applied to the facets to decrease the facet reflection. When an optical signal is injected from the input facet, the light is amplified by the gain of the active layer.

In some semiconductor optical amplifiers, the active layer includes a pair of compound semiconductor layers to confine the electrons inside the active layer, but the semiconductor optical amplifier will still need an extra pair of cladding layers to confine the optical mode. These cladding layers thus form a separate confinement structure. Thus, the electrons and the optical mode are separately confined by different layers.

In some instances, a series of layers known as quantum wells serve as the active region of an SOA. A quantum well SOA has desirable characteristics such as high efficiency, low optical loss, high gain and low operation current. A disadvantage of quantum well SOAs is that the gain provide by either bulk material or the quantum well material is polarization dependent. Quantum well SOAs are thus inherently polarization sensitive.

Quantum well SOAs that are polarization sensitive have limited use because the optical signal is not only amplified but also changed. Polarization sensitivity results in one mode of the optical signal receiving a different gain than another mode of the optical signal. In addition, different modes of a polarized optical signal may travel at different speeds through the optical fiber. This makes the problem of polarization sensitive optical amplifiers more critical.

Attempts to limit or correct this problem have centered on including both compressively strained quantum wells and tensile strained quantum wells in the active region of the SOA. The assumption of including compressively strained quantum wells and tensile strained quantum wells is that the compressively strained quantum wells yield higher gain for transverse electric (TE) modes and the tensile strained quantum wells yield higher gain for transverse magnetic (TM) modes.

Current practice is to adjust the TE mode gain with respect to the TM mode gain through careful design of the composition of the grown material in the active region, the widths of the quantum wells, the amount of strain, and the number of layers included in the active region in order to reduce the polarization sensitivity of SOAs. Reducing or eliminating the polarization sensitivity of SOAs is difficult to achieve because of the uncertainties involved in material growth, where the interface and the quality of the bulk material can vary and therefore cause the imbalance between the TE and TM modal gain, resulting in polarization dependent gain.

BRIEF SUMMARY OF THE INVENTION

These and other problems are overcome by the present invention which is directed to a semiconductor optical amplifier that has polarization independent gain such that the modes of an optical signal receive essentially the same gain. The gain of semiconductor optical amplifiers, including quantum well semiconductor optical amplifiers, is balanced by adding a polarization adjusting layer to the structure of a semiconductor optical amplifier. The polarization adjusting layer effectively repositions an optical mode within an active region of the semiconductor optical amplifier such that the TE mode gain and the TM mode gain of the optical signal are more equal and the polarization sensitivity of the semiconductor optical amplifier is reduced.

One example of an active region of a semiconductor optical amplifier includes both compressively strained quantum wells and tensile strained quantum wells. The compressively strained quantum wells contribute to TE mode gain of the optical signal while the tensile strained quantum wells contribute to the TM mode gain of the optical signal. After the active region has been formed or grown and the cladding layers have also been formed, a polarization adjusting layer is formed on the structure of the semiconductor optical amplifier.

The polarization adjusting layer changes the refractive index profile of the semiconductor optical amplifier in the vertical direction such that the optical mode (or optical spot) is repositioned within the active region. The spot of the optical signal propagating through the active layer can be adjusted in the vertical direction by changing a thickness of the polarization adjusting layer. This lessens the impact of the quantum well growth on the polarization dependence of the semiconductor optical amplifier.

The proper thickness of the polarization adjusting layer can be determined by etching the polarization adjusting layer to different thicknesses, for example, by dropping a slice of the wafer in an etching solution at a fixed speed. The gain of an optical signal is then measured to determine which thickness of the polarization-adjusting layer enables the semiconductor optical amplifier to be polarization independent.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
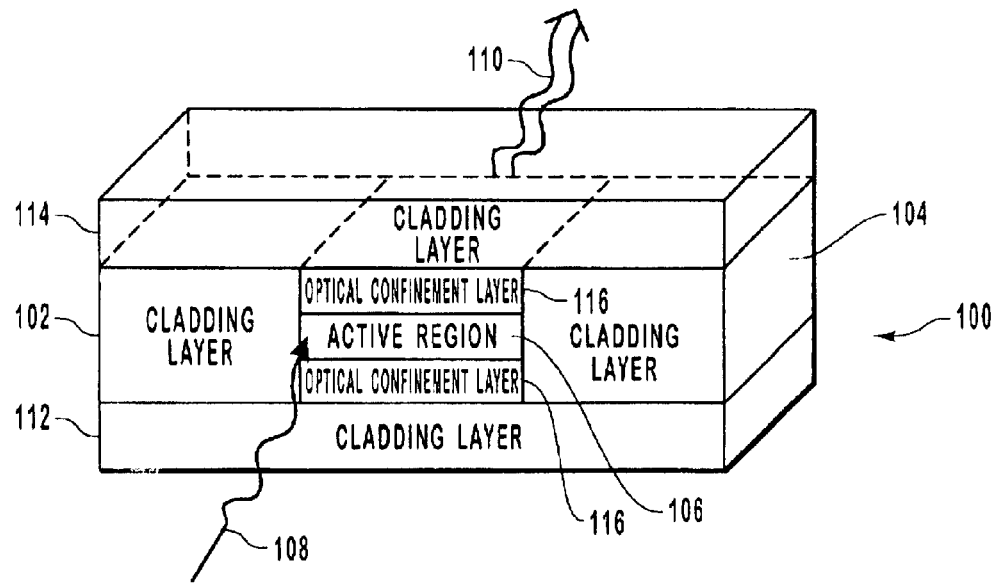
FIG. 1 illustrates a semiconductor amplifier where an active region is confined by cladding layers.

Semiconductor optical amplifiers (SOAs) typically amplify light signals through the principle of stimulated emission. A semiconductor has a conduction band for high mobility electrons, and two valence bands of low mobility holes, a light hole valence band and a heavy hole valence band. The valence band(s) and the conduction band are separated by an energy gap and no energy levels exist in the energy gap. When an electron from the conduction band transitions to the light hole valance band, the gain is TE mode gain and when the transition is between the conduction band and the heavy hole valence band the gain is TM mode gain. The conduction band is typically the higher energy band and the energy refers to electron energy.

If no bias is applied to the SOA, the concentration of electrons in the conduction band is relatively small. When a forward bias is applied to the SOA (often a modified pn-junction) a population inversion may be achieved such that the concentration of electrons in the conduction band is significantly higher. In the presence of an optical signal, electrons are exited at the conduction band and transmitted to the valence band(s) by the process of stimulated emission. Meanwhile, there are electrons going from the valence band to the conduction band which generate spontaneous emission. When an electron transitions from a higher energy level to a lower energy level, a photon is emitted that has the same energy and wavelength as the incident photon. These emitted photons thus amplify the optical signal.

Typically however, the SOAs used to amplify optical signals are more complex than a simple pn-junction. Often, other semiconductor materials are sandwiched or formed between the p-type and n-type regions of the SOA to form an active region or layer. Often, the active region is a strip of semiconductor material that is surrounded by p and n type semiconductor materials that have lower refractive indexes. The active region typically has a higher refractive index than the surrounding p-type and n-type regions of the SOA, thus confining the light during amplification to the active region. The active region may also have a smaller energy band gap than surrounding layers in order to confine the carriers that are injected into the active region. The bandwidth of the active layer is $E_g$ and in one example, there are two layers on the two sides of the active layer which have a band gap of $E_g + \Delta E_g$. The extra bandwidth is for the carrier confinement.

As previously described, the active region of an SOA can introduce some undesirable effects. In particular, the gain provided by the SOA is often dependent on the polarization of the light being amplified, particularly when the active region includes one or more quantum wells. In other words, the transverse electric (TE) mode gain of an SOA is often different than the transverse magnetic (TM) mode gain of the SOA. One effect of this unequal amplification across signal modes is that noise is introduced into the optical signal as it is being amplified due to the polarization state change of the input signal. The present invention is directed to an SOA that has polarization independent gain and to methods of manufacturing SOAs with polarization independent gain.

FIG. 1 is a block diagram that illustrates an example of a semiconductor optical amplifier. The SOA 100 includes an active region 106 that is grown between an cladding layer 114 and an cladding layer 112. The cladding layer 114 may be an n-type semiconductor material while the cladding layer 112 is a p-type semiconductor material. The active region 106 of the SOA 100 is typically bounded by cladding material in the same plane as the active region 106 as illustrated by the cladding layers 102 and 104. The cladding layers 102 and 104 are also a semiconductor material that have a lower refractive index that is lower than the active region 106. The cladding layers 102 and 104 can be either p-type or n-type materials. The plane of semiconductor material including the active region 106 between the cladding layers 114 and 112 can be grown, for example, using masking principles known in the art.

The active region 106 is also formed of semiconductor material, but the active region 106 is typically not the same material as the cladding layers or material. The active region 106 usually has a refractive index that is higher than the cladding layers. This property of the active region 106 helps insure that the active region 106 functions as a wave guide for the optical signal that is amplified by the SOA 100. The active region 106 also includes an additional pair of optical confinement layers 116. The refractive index of the optical confinement layers 116 is usually between the refractive index of the cladding layers and the rest of the active region 106. The optical confinement layers 116 confine the optical modes.

The layers of the semiconductor optical amplifier are typically formed from compound semiconductor materials that have different bandgaps than the substrate but that are lattice matched to the substrate (InP or GaAs substrate, for example). For strained quantum wells, the lattice constant of the wells is different such that the strain is applied from the barrier layer where the lattice matches the substrate. The quantum wells range in thickness from 3 nanometers to 8 nanometers, the barrier layers average 10 nanometers in thickness and the cladding layers 114 and 112 are average 100 nanometers. These ranges are exemplary and it is understood that the present invention is not limited to these ranges.

In this example, an optical signal 108 is introduced or incident into the active region 106 and, when the SOA 100 is forward biased such that a population inversion is present, the stimulated emission of electrons from the higher energy band generates photons with the same energy and wavelength of the incident optical signal, thereby amplifying the optical signal 108 and producing the amplified optical signal 110.

Figure 2A:
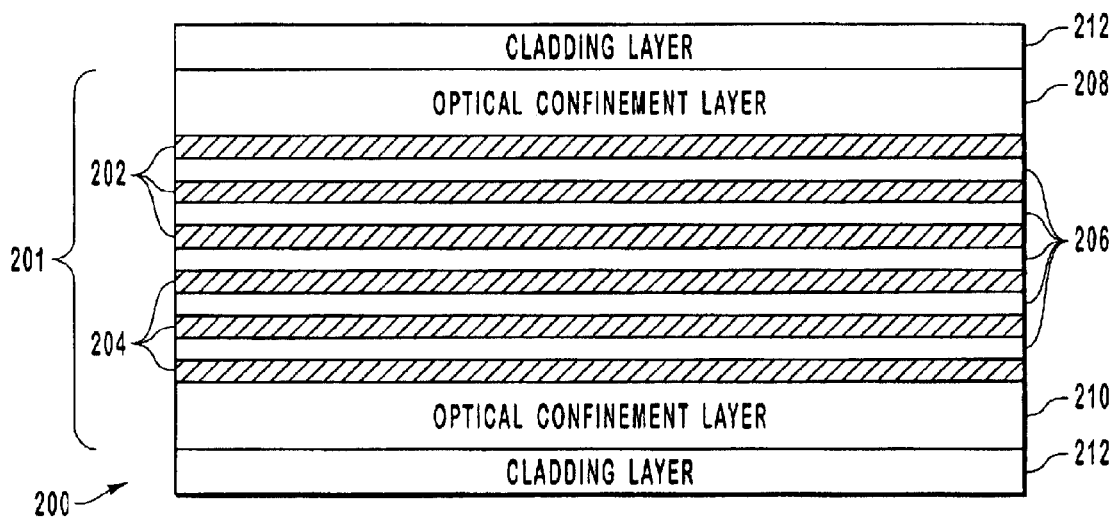
FIG. 2A is a block diagram that illustrates the active region including the compressively strained quantum wells and the tensile strained quantum wells.

FIG. 2A is a block diagram that more fully illustrates an exemplary active region that includes quantum wells. The active region 201 includes quantum well layers (shown as quantum wells 202 and 204) that are separated by barrier layers 206. In this example, the quantum wells 202 are compressively strained quantum wells and the quantum wells 204 are tensile strained quantum wells. Tensile strained quantum wells have the effect of enhancing the TM mode gain while compressively strained quantum wells have the effect of enhancing TE mode gain. It is understood that the present invention extends to embodiments that have other configurations of quantum wells and that it is not necessary to have the same number of compressively strained quantum wells as tensile strained quantum wells. It is further understood that the active region is not limited to quantum wells but may comprise bulk semiconductor material, quantum spots, and the like.

The SOA 200 illustrated in FIG. 2A would be polarization independent if the compressively strain quantum wells 202 and the tensile strain quantum wells 204 are grown or formed such that they have the same efficiency and if the optical field or signal propagating through the active region 201 similarly overlaps the compressively strained quantum wells 202 and the tensile strained quantum wells 204. As previously stated, however, it is very difficult to control the efficiency of both the compressively strain quantum wells 202 and the tensile strained quantum wells 204 such that they have the same efficiency.

FIG. 2A further illustrates the optical confinement layers 208 and 210 that bound the quantum wells. The optical confinement layers 208 and 210 have a higher refractive index than the cladding layers 212 and 214 and help to confine the optical mode while the cladding layers 212 and 214 confine the carrier electrons.

Figure 2B:
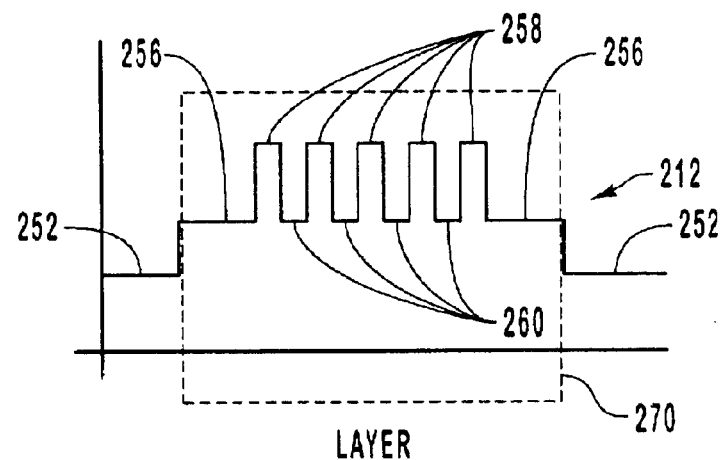
FIG. 2B is a graph illustrating the refractive index of the semiconductor optical amplifier of FIGS. 1 and 2A.

FIG. 2B is a graph that plots the layers of the SOA against the refractive index of the layer. The index 252 thus correspond to the refractive index of the cladding layers. The dashed line 270 indicates the active region of the SOA and the index 256 corresponds to the refractive index of the optical confinement layers. The index 258 corresponds to the refractive index of the quantum wells 202 and 204, while the index 260 corresponds to the refractive index of the barrier layers 206. Thus, the structure of the SOA forms a waveguide because of the relative differences in the refractive indexes of the various layers of the SOA.

Figure 3:
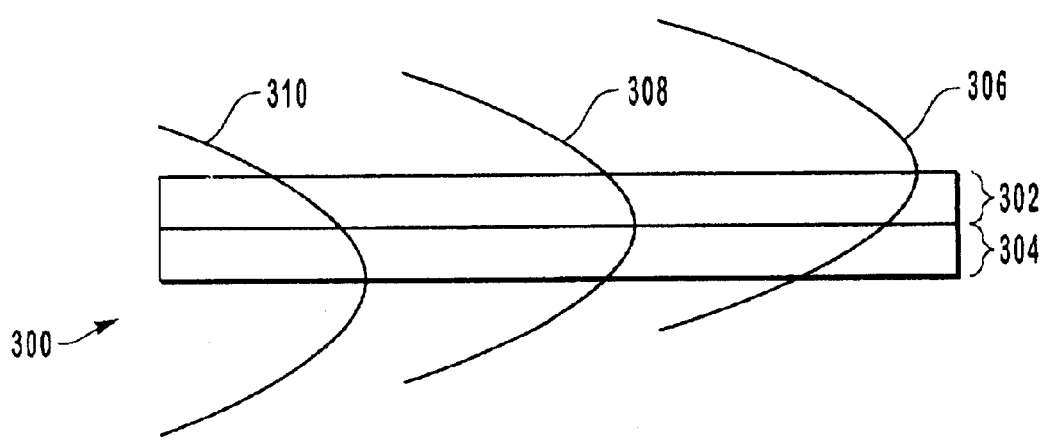
FIG. 3 illustrates the intensity of an optical mode that is propagating through the active region of a semiconductor optical amplifier where the gain is polarization dependent.

FIG. 3 illustrates examples of light signals or of optical modes that are propagating through an active region of a semiconductor optical amplifier. The active region 300 includes compressively strained quantum wells 302 and tensile strained quantum wells 304. When light or an optical signal is propagating through the active region 300, the optical signal will receive TE mode gain from the compressively strained quantum wells 302 and TM gain from the tensile strained quantum wells 304.

As previously stated, the TE gain may not be the same as the TM gain for the optical signal. This concept is illustrated by the curves or optical signals 306, 308, and 310. The curves represent the optical intensity of an optical signal propagating through an active region. In FIG. 3, the optical signal 306 has the most intensity in the compressively strained quantum wells 302. As a result, the optical signal 306 has more TM gain than TE gain. Conversely, the optical signal 310 has the highest intensity in the tensile strained quantum wells 304. The optical signal 310 thus has more TE gain than TM gain. As described below the position of the optical mode can be adjusted using a polarization adjusting layer.

The optical signal 308 illustrates an optical signal whose intensity is substantially balanced between the compressively strained quantum wells 302 and the tensile strained quantum wells 304. The optical gain of the signal 308 is independent of the polarization of the input signal light only if the TE and TM gain provided by the SOA 300 are equal. As previously indicated, it is difficult and expensive to appropriately form the quantum wells such that all quantum wells have the same material quality and give each quantum well the proper level of strain such that the propagation of an optical signal or mode has the same TE and TM modal gain for the optical signal being amplified. The position of an optical signal/mode or of the intensity of an optical signal/mode within the active region thus affects the TE and TM gain that the optical signal ultimately achieves. In other words, the gain of an optical signal as it propagates through the SOA 300 is dependent on the polarization of the optical signal.

Figure 4:
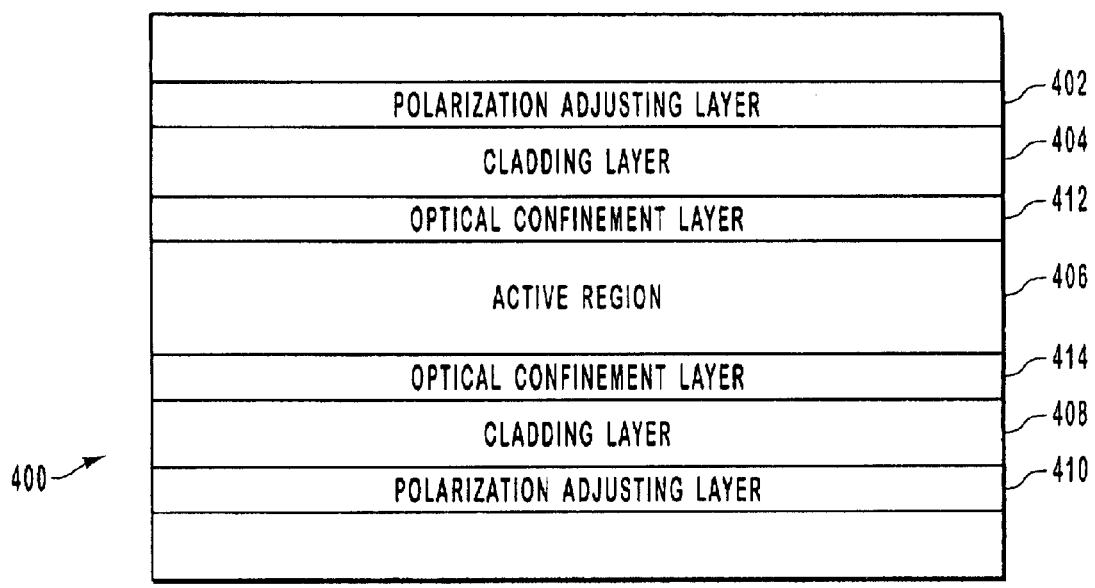
FIG. 4 is a block diagram that illustrates the structure of a semiconductor optical amplifier with a polarization adjusting layer.

FIG. 4 illustrates an SOA 400 that is able to effectively adjust the intensity or position of the optical signal such that the gain of the optical signal is no longer dependent on the polarization of the optical signal. The present invention also accounts for variations in the quantum well layers such that the gain is polarization independent.

FIG. 4 illustrates an SOA 400 where a polarization adjusting layer 402 and a polarization adjusting layer 410 are included or formed on the SOA 400. While FIG. 4 illustrates two polarization adjusting layers 402 and 410, it is possible to have a single polarization adjusting layer that is formed or grown on the SOA 400. The refractive index of the polarization adjusting layer is typically between the refractive index of the active region and the refractive index of the cladding layers.

When an optical signal is received or incident into the SOA 300, the TM and TE gain of the signal are substantially equalized by at least one of the polarization adjusting layers. The polarization adjusting layer 402, for example, has an effect on where the position or intensity of the optical signal/mode with respect to the active region of the SOA by changing the relative refractive index or by altering the optical confinement factor of the propagating optical signal. By changing the thickness of the polarization adjusting layer, the optical signal can be moved or repositioned within the active region of the SOA.

For example, if the TM gain from the tensile strained quantum wells is larger than the TE gain from the compressively strained quantum wells, the thickness of the polarization adjusting layer 402 can be reduced to move the optical signal up into the compressively strained quantum wells in order to provide additional TE gain to the optical signal.

The polarization adjusting layer 402 eliminates the need to redesign the SOA by adjusting, for example, the composition of the material that is grown or formed in the active region, the width of the quantum wells, the amount of strain, or the number of layers of the SOA in order to reduce the polarization sensitivity of the quantum well. In accordance with the present invention, the polarization sensitivity of the SOA can be essentially eliminated by simply changing the thickness of one or both of the polarization adjusting layers.

Figure 5:
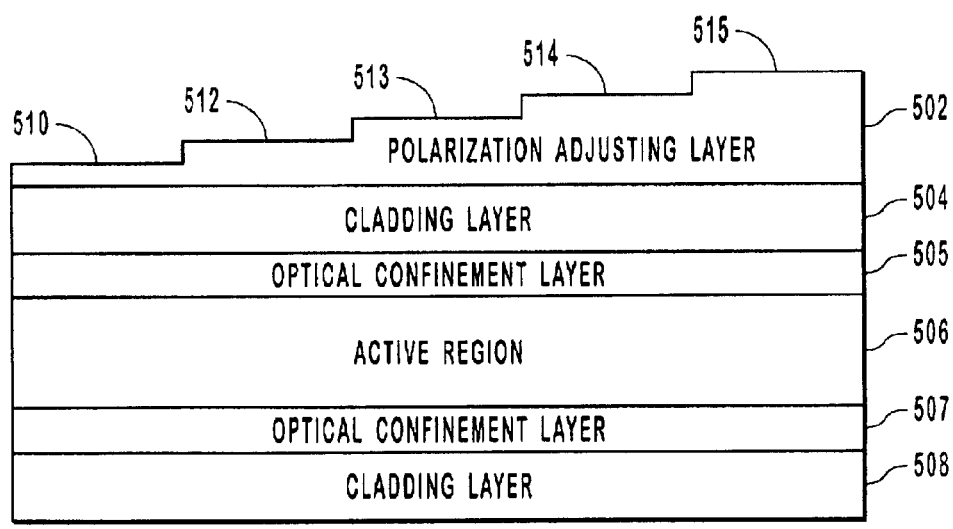
FIG. 5 is a block diagram for illustrating an exemplary method of determining a proper thickness for the polarization adjusting layer.

FIG. 5 is used to illustrate one example of how an SOA can be manufactured or produced such that the SOA is insensitive to the polarization of the optical signal being amplified. When the SOA is being formed, it is typically grown on either GaAs or InP substrate. The layers are grown or formed from the bottom up beginning with a buffer layer and followed by the lower cladding layer 508 (or n type semiconductor material), the lower optical confinement layer 507, the active region 506, the upper optical confinement layer 404, the upper cladding layer 504 (or p type semiconductor material), and the polarization adjusting layer 502.

After the polarization adjusting layer 502 is formed, the SOA 500 can be passed through an etching solution using, for example, a stepping motor. In this example, the stepping motor advances such that the step 510 is inserted in the etching solution while the remaining portion of the polarization adjusting layer 502 is not being etched. With each advance of the stepping motor or other etching control, more of the polarization layer is immersed in the etching solution.

This creates a polarization adjusting layer 502, as shown in FIG. 5, that has one or more steps. This example illustrates the steps 510, 512, 513, 514, and 515 and each step of the polarization adjusting layer has a different thickness. A test optical signal may now be used to determine which step of the polarization adjusting layer 502 results in amplification of the optical signal that is polarization independent. In other words, the thickness of the polarization layer moves the optical signal within the active region such that the TM mode gain and the TE mode gain are substantially balanced. Once the appropriate thickness is known, the polarization adjusting layer can be etched to the appropriate thickness and SOAs that are not sensitive to the polarization of the optical signal can be inexpensively produced.

Figure 6:
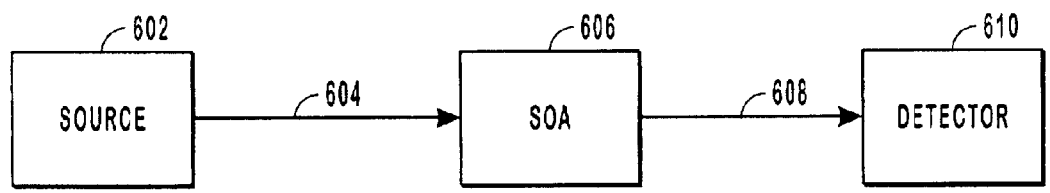
FIG. 6 illustrates an exemplary system where the present invention may be implemented.

FIG. 6 is a block diagram that illustrates an exemplary use of a semiconductor optical amplifier that is polarization independent. FIG. 6 illustrates an optical signal source 602 that is coupled with a fiber 604. The fiber 604 can be any type of fiber of any material, including a single mode fiber and a multimode fiber. The distance between the source and the SOA is such that the optical signal requires amplification. The distance may be a function of fiber composition, physical distance, and the like.

The source 602 generates a light signal whose polarization is either known or unknown. The signal is carried by the fiber 604 until it reaches the SOA 606. The SOA 606 includes a polarization adjusting layer and is able to amplify the signal regardless of the polarization of the signal. The amplified signal is carried to the detector 610 by the fiber 608 where it is appropriately processed. It is understood that the SOA described herein is not limited to the amplification of optical signals.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A semiconductor optical amplifier that generates gain for an optical signal that is substantially independent of a polarization of the optical signal, the semiconductor optical amplifier comprising:

a first cladding layer and a second cladding layer;

an active region that forms a strip between the first cladding layer and the second cladding layer;

a plurality of quantum wells within the active region, wherein at least one of the plurality of quantum wells is compressively strained and at least one of the plurality of quantum wells is tensile strained; and a polarization adjusting layer formed on the first cladding layer, wherein the polarization adjusting layer repositions an optical signal propagating through the active region.

2. A semiconductor optical amplifier as defined in claim 1, wherein the first cladding layer is formed from an n-type semiconductor material and wherein the second cladding layer is formed from a p-type semiconductor material.

3. A semiconductor optical amplifier as defined in claim 1, wherein the active region is positioned in a plane between the first cladding layer and the second cladding layer, wherein the strip formed by the active region is also bounded by a third cladding layer in the plane.

4. A semiconductor optical amplifier as defined in claim 1, wherein the plurality of quantum wells are separated by barrier layers.

5. A semiconductor optical amplifier as defined in claim 1, wherein the polarization adjusting layer has a thickness, wherein the thickness has been selected to reposition the optical signal within the active region.

6. A semiconductor optical amplifier as defined in claim 1, further comprising a second polarization adjusting layer formed on the second cladding layer.

7. A semiconductor optical amplifier as defined in claim 1, wherein the active region further comprises a pair of optical confinement layers that bound the plurality of quantum wells and wherein the pair of optical confinement layers confine an optical mode.

8. A semiconductor optical amplifier as defined in claim 1, wherein the active region has a refractive index that is greater than a refractive index of the first and second cladding layers.

9. A semiconductor optical amplifier that substantially balances transverse electric gain and transverse magnetic gain of an optical signal, the semiconductor optical amplifier comprising:

an active region that includes a plurality of quantum wells that are separated by barrier layers, wherein at least one of the plurality of quantum wells is a compressively strained quantum well and wherein at least one of the plurality of quantum wells is a tensile strained quantum well;

an n-type semiconductor material layer and a p-type semiconductor material layer that are positioned such that the active region forms a strip that is bounded by the n-type semiconductor material layer and the p-type semiconductor material layer; and a polarization adjusting layer formed on either the n-type semiconductor material layer or the p-type semiconductor material layer, wherein the polarization adjusting layer adjusts a position of an optical signal within the active region such that the transverse electric gain from the at least one compressively strained quantum well is substantially balanced with the transverse magnetic gain from the at least one tensile strained quantum well.

10. A semiconductor optical amplifier as defined in claim 9, wherein the active region has a refractive index that is greater than the n-type semiconductor material layer and greater than the p-type semiconductor material layer.

11. A semiconductor optical amplifier as defined in claim 9, wherein the polarization adjusting layer has a thickness, wherein the thickness of the polarization adjusting layer determines how the optical signal is positioned in the active region such that changing the thickness of the polarization adjusting layer alters the position of the optical signal in the active region.

12. A semiconductor optical amplifier as defined in claim 9, wherein the polarization adjusting layer causes a region of maximum intensity of optical signals that propagate through the active region to be moved toward the polarization adjusting layer.

13. A semiconductor optical amplifier as defined in claim 9, wherein the active region includes a compressively strained portion and a tensile strained portion, wherein the compressively strained portion includes compressively strained quantum wells and the tensile strained portion includes tensile strained quantum wells.

14. A semiconductor optical amplifier as defined in claim 13, wherein the compressively strained portion provides more transverse electric gain to the optical signal to balance the transverse magnetic gain of the optical signal when the optical signal is repositioned such that more intensity of the optical signal propagates through the compressively strained portion of the active region.

15. A semiconductor optical amplifier as defined in claim 13, wherein the tensile strained portion provides more transverse magnetic gain to the optical signal to balance the transverse electric gain of the optical signal when the optical signal is repositioned such that more intensity of the optical signal propagates through the tensile strained portion of the active region.

16. A method for fabricating a semiconductor optical amplifier that substantially balances transverse electric mode gain and transverse magnetic mode gain of an optical signal, the method comprising:

forming an active region on a first cladding layer, wherein the active region includes a compressively strained portion that includes at least one compressively strained quantum well and a tensile strained portion that includes at least one tensile strained quantum well, wherein the compressively strained portion and the tensile strained portion are bounded by optical confinement layers;

forming a second cladding layer on the active region such that the active region forms a strip between the first cladding layer and the second cladding layer; and forming a polarization balancing layer on the second cladding layer such that the transverse electric gain of the optical signal substantially balances the transverse magnetic gain of the optical signal.

17. A method as defined in claim 16, wherein forming a polarization balancing layer on the second cladding layer further comprises:

determining a thickness of the polarization balancing layer that balances the transverse electric and transverse magnetic gain; and etching the polarization adjusting layer to the thickness.

18. A method as defined in claim 17, wherein determining a thickness of the polarization adjusting layer further comprises:

passing the polarization adjusting layer through an etching solution in steps such that the polarization adjusting layer has one or more steps and each step has a different thickness; and determining which step balances the transverse electric gain and the transverse magnetic gain of the optical signal.

19. A method as defined in claim 16, further comprising forming a second polarization adjusting layer on the first cladding layer.

* * * * *

UNITED STATES PATENT AND TRADEMARK OFFICE
CERTIFICATE OF CORRECTION

PATENT NO.       : 6,798,568 B1                                              Page 1 of 1
APPLICATION NO.  : 10/134412
DATED            : September 28, 2004
INVENTOR(S)      : Steve Wang and Frank Levinson It is certified that error appears in the above-identified patent and that said Letters Patent is hereby corrected as shown below:

Drawings,
Figure 2A, change "CLADDING LAYER" from "212" to -- 214 --.

Column 2,
Line 1, change "provide" to -- provides --.

Column 4,
Line 47, after "grown between" change "an" to -- a --.
Line 48, after "114 and" change "an" to -- a --.
Line 55, delete "that is lower".

Column 5,
Line 47, after "compressively" change "strain" to -- strained --.
Line 48, after "tensile" change "strain" to -- strained --.
Line 54, after "compressively" change "strain" to -- strained --.
Line 64, after "252 thus" change "correspond" to -- corresponds --.

Column 7,
Line 32, change "404" to -- 505 --.

Signed and Sealed this

Fourth Day of July, 2006

JON W. DUDAS
*Director of the United States Patent and Trademark Office*